United States Patent
Quint et al.

(10) Patent No.: US 7,206,704 B2
(45) Date of Patent: *Apr. 17, 2007

(54) BATTERY MANAGEMENT SYSTEM AND APPARATUS

(75) Inventors: Jonathan B. Quint, Sudbury, MA (US); Steven H. Dworkin, Newton, MA (US)

(73) Assignee: Batterycorp., Inc., Newton, MA (US)

( * ) Notice: Subject to any disclaimer, the term of this patent is extended or adjusted under 35 U.S.C. 154(b) by 75 days.

This patent is subject to a terminal disclaimer.

(21) Appl. No.: 11/025,305

(22) Filed: Dec. 29, 2004

(65) Prior Publication Data

US 2005/0143955 A1 Jun. 30, 2005

Related U.S. Application Data

(63) Continuation-in-part of application No. 10/749,004, filed on Dec. 30, 2003, now Pat. No. 7,003,431.

(51) Int. Cl.
*G06F 19/00* (2006.01)
*G01R 31/36* (2006.01)

(52) U.S. Cl. ........................... 702/63; 702/183

(58) Field of Classification Search ............ 702/63, 702/182, 183, 184, 185; 324/426, 430, 431, 324/433, 434; 320/106, 109

See application file for complete search history.

(56) References Cited

U.S. PATENT DOCUMENTS

| 4,222,665 | A | 9/1980 | Tachizawa et al. ......... 356/218 |
| 5,545,967 | A | 8/1996 | Osborne et al. ............ 320/109 |
| 6,353,800 | B1 | 3/2002 | Rector ......................... 702/63 |
| 6,456,036 | B1 | 9/2002 | Thandiwe ................... 320/106 |
| 6,885,195 | B2 * | 4/2005 | Bertness ...................... 324/426 |
| 2004/0251907 | A1 | 12/2004 | Kalley ......................... 324/426 |
| 2005/0044451 | A1 * | 2/2005 | Fry et al. ..................... 714/38 |

* cited by examiner

*Primary Examiner*—Bryan Bui
(74) *Attorney, Agent, or Firm*—Peter S. Canelias

(57) ABSTRACT

The invention relates to the management of large stationary batteries. The invention is a comprehensive process for the management of stationary batteries that are used for backup power and are deployed in widely dispersed locations. The OMS™ (Optimization Management System) solution is comprised of Mega-Tags (preferably serialized bar-coded identification labels), a battery testing and data acquisition device, and web-based software. The OMS™ system employs algorithmic testing to determine whether a particular battery unit needs to be replaced or whether it can be advantageously redeployed. These components work together to provide a platform for managing a large number of perishable, expensive, and geographically dispersed assets.

16 Claims, 5 Drawing Sheets

OMS™ REPLACEMENT METHODOLOGY FRAMEWORK

☐ OMS™ ENABLED FUNCTION

BATTERY MANAGEMENT SYSTEM AND APPARATUS

CROSS REFERENCE TO RELATED APPLICATION

This application is a continuation-in-part of, and claims priority to, U.S. application Ser. No. 10/749,004, filed Dec. 30, 2003 now U.S. Pat. No. 7,003,431, which is incorporated herein by reference in its entirety.

BACKGROUND OF THE INVENTION

The invention relates to the management of large stationary batteries. The invention is a comprehensive system and apparatus for the management of stationary batteries that are used for backup power and are deployed in widely dispersed locations. The OMS™ (Optimization Management System) solution is comprised of battery tags (sometimes referred to herein as "Mega-Tags," which are preferably serialized bar-coded identification labels), a battery testing and data acquisition device, and the OMS™ web-based software. These components work together to provide a platform for managing a large number of perishable, expensive, and geographically dispersed assets.

The invention solves many of the unique problems associated with batteries. Batteries are perishable. That is, they have a limited shelf-life and a limited useful life. Stationary industrial batteries of the type that benefit from the OMS™ solution are typically sealed lead-acid batteries. These electromechanical devices typically must be installed within 6–10 months from date of manufacture or else they need to be recharged. In addition, most of these batteries are designed for a 10 year useful life, but in the field generally last only from 2–6 years. The discrepancy between design life and actual life is a major problem for users of these batteries.

Stationary batteries are also large, heavy and expensive. They are generally used in large numbers to provide the required backup power. Keeping track of these devices therefore provides an additional asset management challenge.

Batteries contain hazardous substances which are toxic to the environment. There are strict rules and regulations governing the disposal of batteries. These rules and regulations also contain documentation requirements. Users must be able to provide adequate proof of compliance or face severe penalties. Documentation is a highly manual, expensive process, and most compliance is done as an afterthought.

Batteries are generally deployed in strings of two or four 12-volt units, in strings of three 12-volt units, or in strings of six or twelve 2-volt units, in order to power 24 volt, 36 volt or 48 volt equipment. This electrical combination of batteries compounds the difficulty of managing these storage devices. In sum, managing stationary batteries is difficult, and is generally not a core competency of most businesses that use these batteries.

BRIEF SUMMARY OF THE INVENTION

The OMS™ (Optimization Management System) tracks batteries from cradle-to-grave. It enables companies with large deployments of stationary batteries to manage assets that are both perishable and geographically dispersed, and therefore difficult to mange. OMS™ is comprised of the following items which work together to provide this unique service: First, Mega-Tags (preferably serialized bar-coded identification labels) are affixed to every individual battery. A battery testing device (preferably the BatteryCorp BC-T2000 or similar testing device), which contains both a bar code reader and a serial port to connect to a PC, scans a Mega-Tag and then performs its test on any given battery. Batteries are usually deployed in "strings" of electrically interconnected units to increase voltage and output power. Each battery test data point is stored along with the unique identifier value associated with the individual battery unit. The user connects the BatteryCorp BC-T2000 (or similar testing device) to the serial port of a PC with the provided null-modem cable. Linking software (preferably the T2000 Link software) facilitates the transfer of data from the testing and data acquisition device to the PC internal storage. The user then logs into the proprietary website and clicks on the Upload Data icon; OMS™ then uploads the specified data file to a proprietary web server. The web server processes the data file, storing the pertinent data in the appropriate tables of the OMS™ database.

The invention provides comprehensive reporting and analysis options. This includes both operational and financial reports, as well as detailed recycling documentation. The OMS™ auto-notification feature emails reminders to customer technicians that testing is required. These emails are based upon customer-defined business rules. (Testing time period interval and escalation procedure, by business unit.)

The OMS™ solution enables users of stationary batteries to manage all aspects of their battery deployments. It is the only available tool that automates the process of uniquely identifying, testing, evaluating and reporting on the state of health of any given battery. It provides information on installation, deployment, testing, recycling and destruction. It provides information in both aggregate and detail formats, for both internal and external use.

Its advantages are many. It enables users to manage large, widely dispersed deployments of stationary batteries in an efficient and cost effective manner. It increases the reliability of the backup power plant, because the operator now has information on the performance status of the batteries. The system also facilitates the safe recycling of potentially toxic devices, while reducing the risk of non-compliance with governmental regulations.

The specific application of OMS™ that is the replacement method invention is that OMS™ applies customer business rules to the uploaded test data, and automatically instructs the technician as to which specific battery or batteries, by serial number, need to be replaced. The technician no longer has to make any decisions, thus removing subjectivity from the process. OMS™ both produces reports which detail the specifics of the batteries to be replaced, and it sends automated email messages to the appropriate technician, with the relevant installation instructions.

Another object of the invention is to provide a battery management system easily applied to existing batteries without modification of the batteries, and that easily accommodates a varied inventory of batteries from different manufacturers.

Other objects and advantages will be more fully apparent from the following disclosure and appended claims.

BRIEF DESCRIPTION OF THE DRAWINGS

The above-mentioned and other features and objects of this invention and the manner of obtaining them will become apparent and the invention itself will be best understood by reference to the following description of an embodiment of the invention taken in conjunction with the accompanying drawings, wherein.

DETAILED DESCRIPTION

The invention provides and coordinates battery testing, maintenance, installation, fulfillment and disposal of batteries, and is capable of performing these functions over a wide geographical area. It seamlessly integrates these services via the BatteryCorp BC-T2000 tester and the OMS™ web based platform. This innovative solution helps companies improve their backup power systems while reducing costs.

Figure 1:
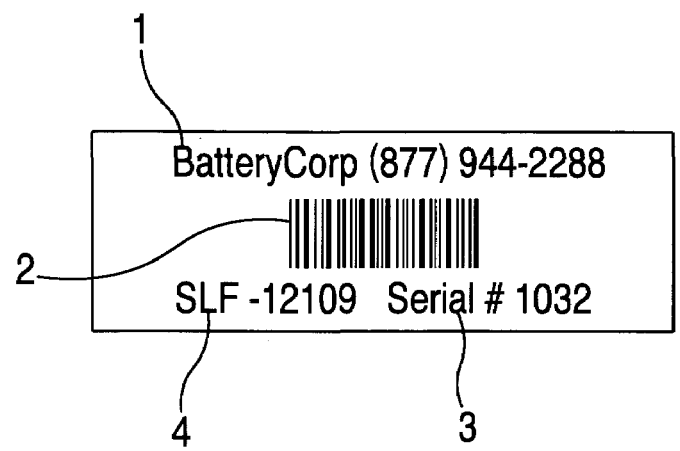
FIG. 1 is a representation of a tag for use with the present invention.
Figure 2:
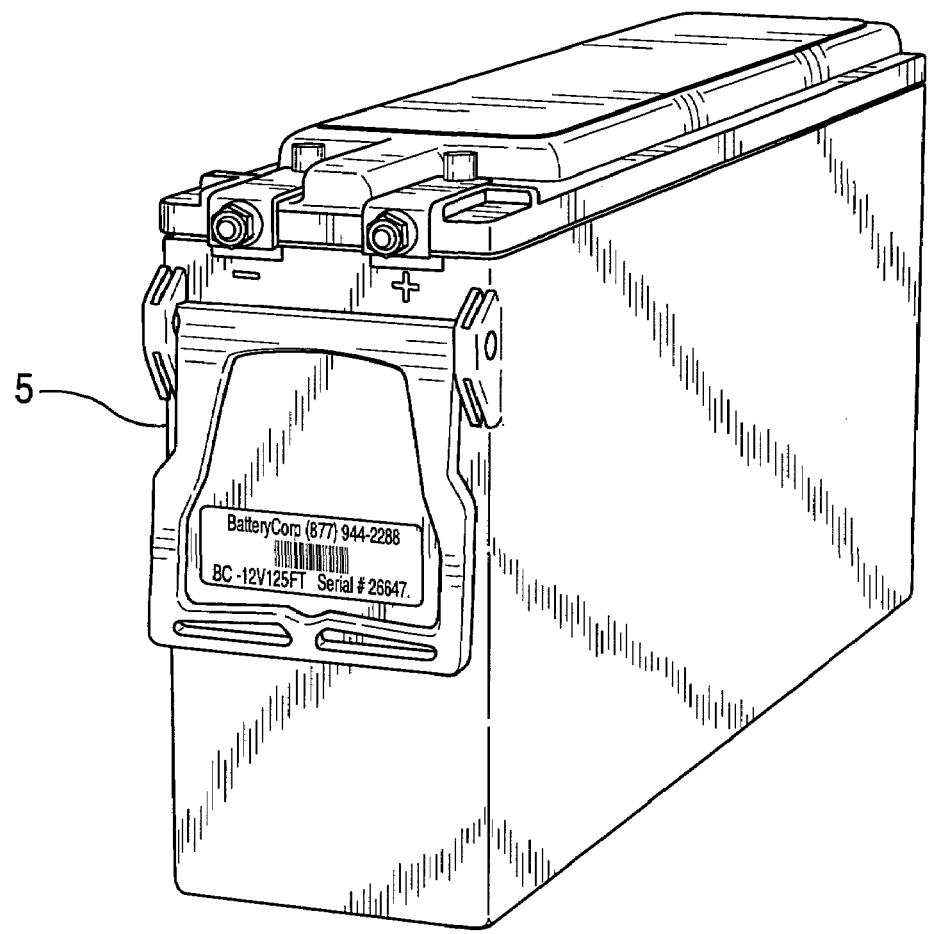
FIG. 2 is a perspective view of a battery unit with a tag associated with the battery.

FIG. 1 shows a preferred Mega-Tag to be associated with an individual battery. The tag is associated with a particular battery unit, so that the unique identification number embedded in the tag is consistently associated with that particular battery. Preferably to assure such continued association, the Mega-Tag is affixed to the exterior casing of the battery (5) with an adhesive, as shown in FIG. 2.

Mega-Tags are preferably bar coded labels that contain a unique identifier for the associated battery. The tag shown in FIG. 1 has, preferably, the following information: (1) the service provider name and telephone number; (2) the bar code of a unique identification number; (3) the battery model; and (d) the unique identification number in human readable form. Because of the preferred inclusion of human readable information in conjunction with the bar code identification number, the Mega-Tag is preferably affixed where it can be viewed and scanned by a human operator without dislocating the battery.

Figure 3:
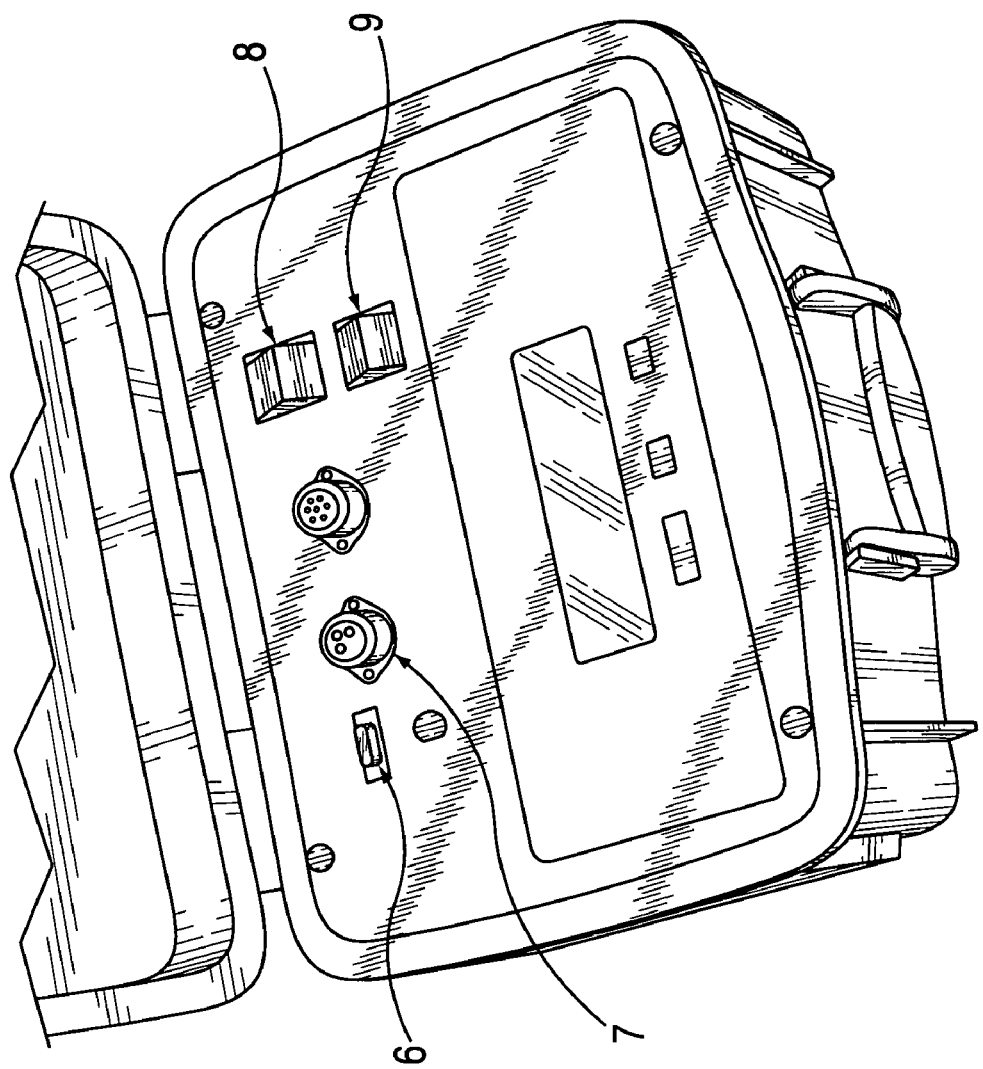
FIG. 3 is a view of a battery testing and data acquisition device for use with the present invention.

FIG. 3 shows a testing and data acquisition device for use with the present system. The device shown is a BatteryCorp BC-T2000 device. However, different testers could be used, but such testers should be able to import data from a bar code reader, and have the ability to export data files. The bar code scanner or reader is preferably in direct communication with the battery testing device for ease of use and reliable interface. This is preferably accomplished by use of a port (6) for a bar code reader and for connection to a computer. Also shown in FIG. 3 are ports for two testing probes (7), and A/C current in port (8) and an on/off switch (9). The data files can be in a number of formats, since the invention is a flexible platform with the ability to interface with data files in a number of formats.

In particular, the battery tester should be able to store test results in memory, associating each test with the pertinent unique scanned identifier. The tester also should be able to output the test results in an industry-standard file format, such as ASCII text or Excel XLS. The tester should be able to perform impedance or conductance testing (IEEE approved technologies). Many companies that utilize stationary batteries perform impedance or conductance tests.

In an alternative embodiment, the tester may operate with an infra-red thermometer, either integrated with the battery tester or otherwise in communication with the tester. The thermometer would read the temperatures of individual batteries, and the temperature associated with the unique identifier for that particular unit. Such a thermometer would provide additional information concerning the subject battery unit that would be read, uploaded and stored. Such a thermometer would obviate the need for a separate thermometer to record ambient temperature surrounding the battery units, which is stored along with the battery test data, and provide a more accurate reading of individual unit temperatures.

The testing device files preferably have the following header information. First, a Location Code is included with the file. This is a code that links the database of the invention, indicating the location of the battery. Second, the ambient temperature is stored along with the test information, because battery temperature is correlated with life expectancy. This information is also required by many battery manufacturers for warranty claims.

The testing device files preferably have the following detail information. First, there is a Unique Identifier that identifies the individual battery unit. Second, the date and time of the test are included in the file. Third, the test value, which is the individual battery unit test result, typically either an impedance value or a conductance value. It is the key indicator of the battery's health. The greater the impedance or the lower the conductance (they are inverse measurements of the same attribute) the poorer the state of health of the battery. Fourth, a strap test value, which is optional. Strap testing is a test of the interconnection between the current battery itself and the next battery in sequence (in the string). Fifth, a voltage is included, which is the voltage measurement of the battery. Voltage is another indicator for battery health and is also an indicator of the status of the device which is used to charge the battery.

Database management is another component of the present invention. Each battery test data point is stored along with the unique identifier value associated with the individual battery unit. This enables trend analysis reporting and individual battery detail reporting.

In operation, the user connects the battery testing device to the serial port of a PC with a null-modem cable, a standard computer peripheral device which is readily available. The linking software facilitates the transfer of data from the testing and data acquisition device to the PC internal storage. Typically, the user clicks the "Transfer" button displayed on the graphical user interface (GUI) of the software. The response will be "Waiting for data." Prompts on the battery tester will guide the user to the menu option for downloading the data.

The user then logs in to the proprietary service provider website. The user will then click on the Upload Data icon displayed within the GUI. The linking software then uploads the specified data file to a proprietary web server. The web server processes the data file, storing the pertinent data in the appropriate tables of the OMS™ database.

Data elements stored include:

a. Unique ID b. ID of the user who performed the test c. Test date and time d. Test type (Impedance or Conductance)

e. Test measurement value f. Strap measurement value if applicable g. Voltage h. Ambient temperature The invention then generates comprehensive reporting and analysis, including preferably the following:
a. Battery Test History (detail by location)
b. Battery Test Summary (overview of tests and results)
c. Untested Batteries (verification tool)
d. Battery Installation Aging (based upon installation date)
e. Performance Status Report (analysis which groups batteries based upon user-defined status criteria for "pass", "fair", "warning" and "fail")
f. Replacement Forecast (analysis based upon user-defined criteria to estimate costs of upcoming replacements)

Auto-notification is another part of the present invention. This feature is based upon customer-defined business rules. These rules typically test interval and escalation procedure, automatic battery replacement intervals and escalation procedures. These business rules can be specified by customer-defined business units. Business units might be geographical areas, product line groupings, etc. This provides considerable flexibility for the user in how to utilize the automated notification process. All notifications are preferably made via email or other electronic transmission means.

Figure 4:
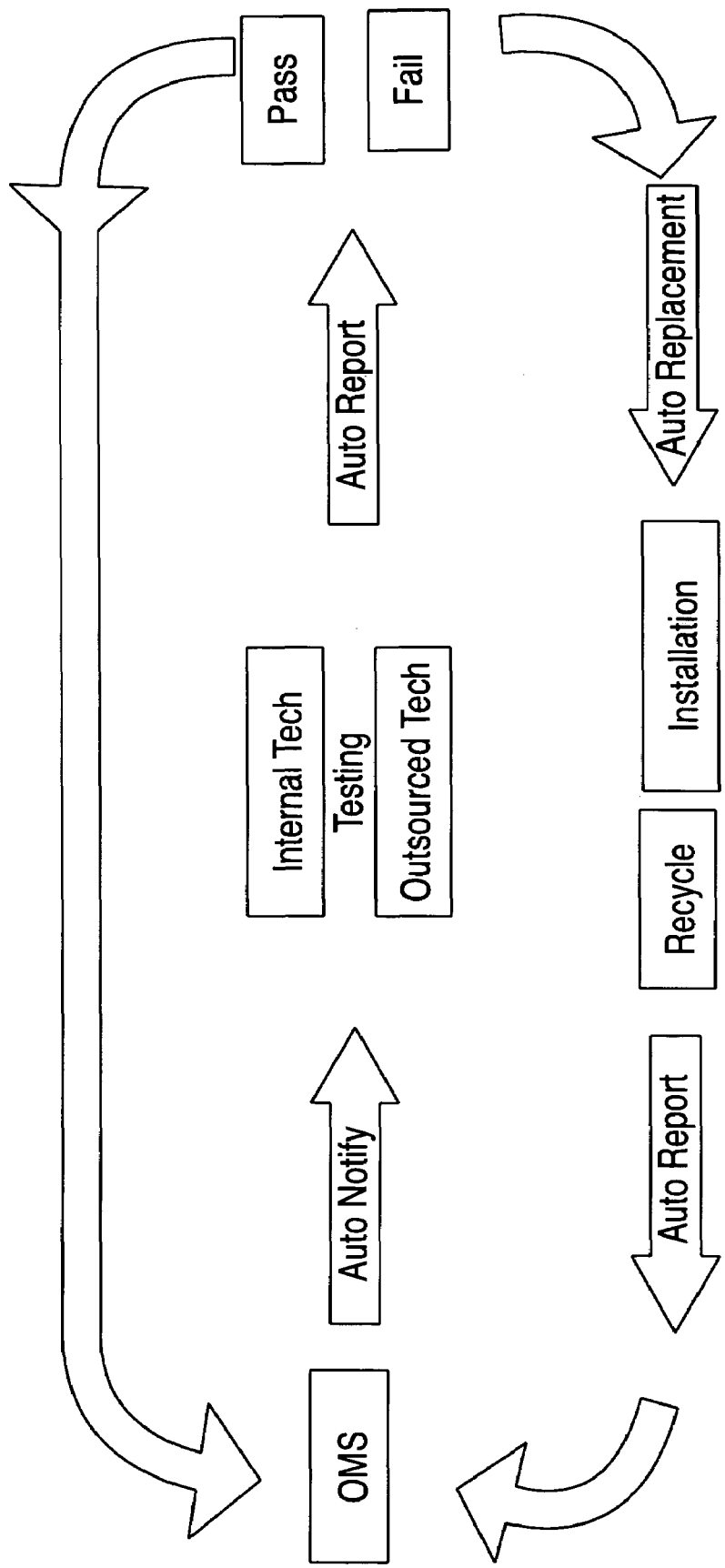
FIG. 4 is a flow diagram illustrating the process of the present invention.

FIG. 4 provides a high-level overview of the process of the present invention. The OMS™ software will send an automated email notification to the pertinent technician that various locations require battery testing. This process is called Auto Notification. The person that is informed of the required testing can be either an internal (i.e. employee of the customer company) or an outsourced (third party) technician. This Auto Notification feature is not required for functioning of the present invention, since users may utilize the OMS™ software with this feature disabled, and set up their testing schedule separately.

The technician tests the batteries with the batter tester and uploads the data via a network connection, preferably a global computer network such as the Internet, to the OMS™ proprietary database, preferably located on a server. Upon receipt of uploaded data files, the OMS™ software immediately processes the data and sends an automated report (Auto Report) back to the technician. The report will indicate whether the batteries all "Passed," or if any "Failed" the test. The report may also provide instructions to the technician on whether or not to replace any given battery or all batteries, depending upon the business rules for that customer (Auto Replacement). If Auto Replacement is enabled, the OMS™ software will route the appropriate information to the pertinent installation technician. The OMS™ software may provide recycling documentation, so that batteries being replaced may be properly recycled.

An Auto Report is generated via the battery tester and sent via a network connection, preferably through a global computer network such as the Internet, to the OMS™ proprietary software and to the OMS™ database.

The OMS™ software platform has been built using programming tools from Microsoft. The integrated development environment (IDE) includes productivity boosting features such as automated syntax management, a powerful editor, line-by-line debugging, graphical design tools (including visual classes and subclasses), and integrated database access. The platform is fully object-oriented, offering developers the benefits of full inheritance, encapsulation and polymorphism. This dramatically reduces design, coding, and testing times, producing a highly efficient rapid application development (RAD) environment.

The methodology employed in the OMS™ platform can be referred to as business function modeling (BFM). The entire orientation of the development effort revolves around the business rules and processes. This may also be referred to as an object functional model. Each function encapsulates a particular business task, yet from a development point of view it also inherits any and all system functions necessary to perform the intended task.) For example, a purchase order object would accept the request, access the necessary data, employ all pertinent business rules, validate the posted data, update the database, and generate a response—all within a single software object. This is a major architectural advantage.

Figure 5:
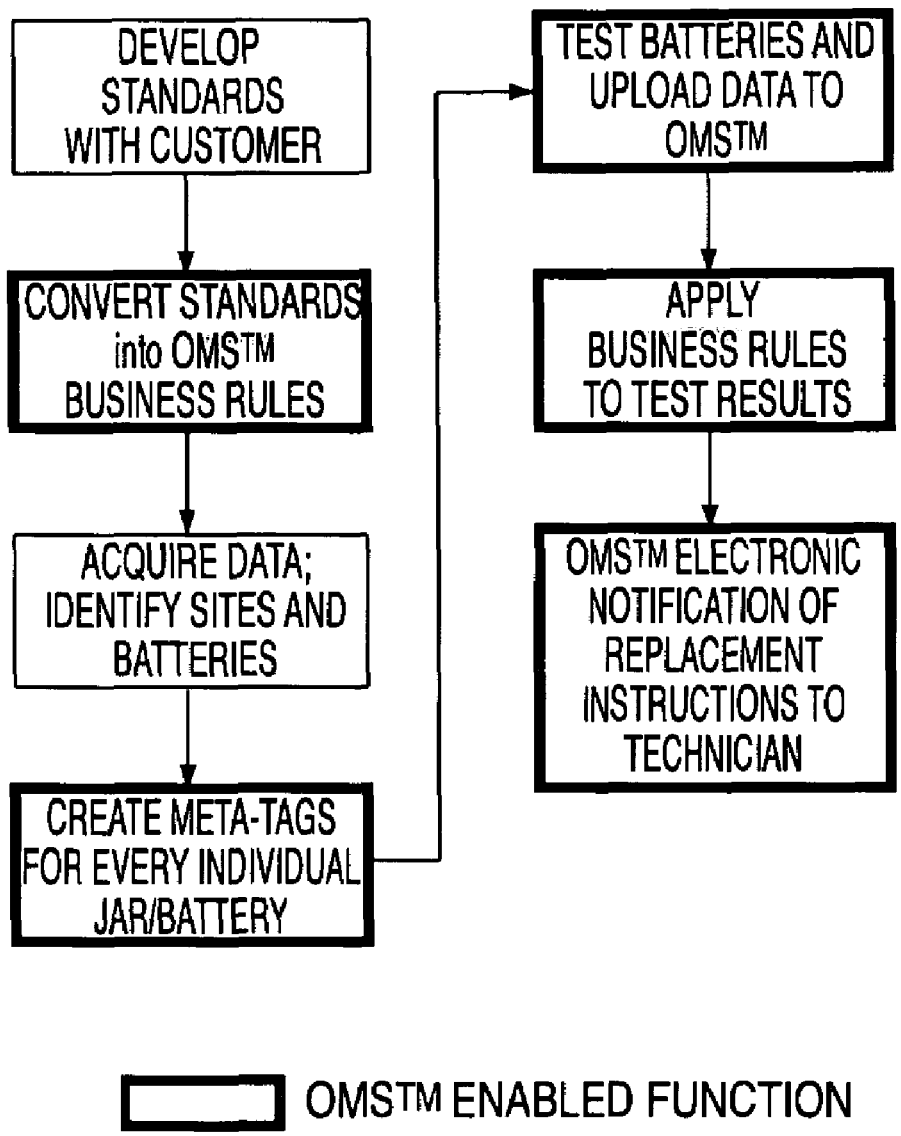
FIG. 5 is a flow diagram illustrating the battery replacement methodology.

FIG. 5 shows the Replacement Methodology Framework that comprises the steps of
Developing standards with the customer
Converting standards into OMS™ business rules
Acquiring data, identifying the sites and batteries
Creating Mega-Tags for every individual jar/battery
Testing the batteries and uploading the data to OMS™
Applying the business rules to the test results
Electronic notifying of replacement with instructions to technician keyed to the battery to be replaced.

Figure 6:
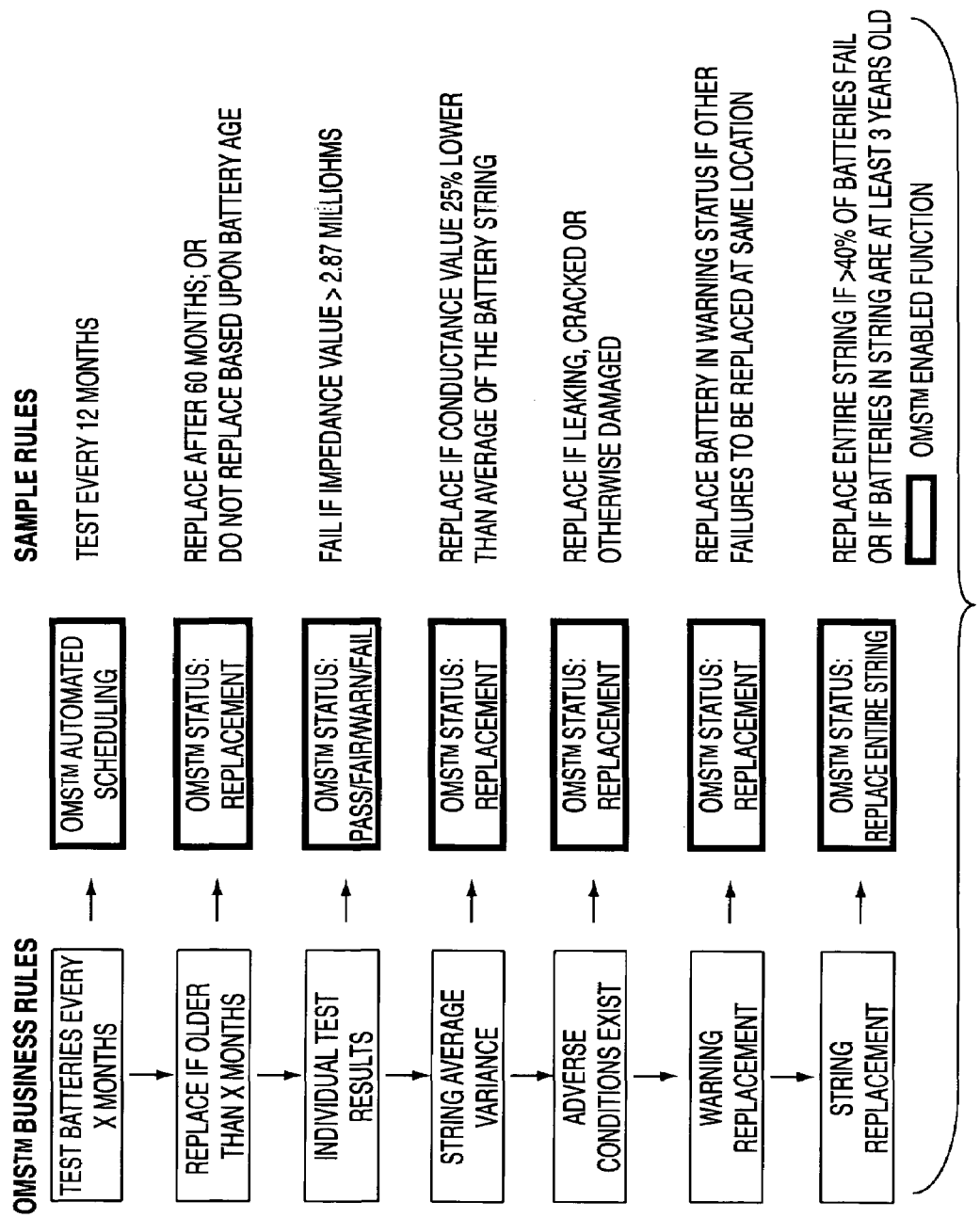
FIG. 6 is a flow diagram illustrating a sample application of the replacement methodology.

FIG. 6 also shows a set of sample rules created for the replacement determination method, together:
The general rule is to test batteries every X months, X being a value assigned in view of the particular type of batteries. The X value can be automatically scheduled by the OMS software. The sample value for X is shown as 12 months. Common values for X are 3 months, 6 months, and 12 months.

The second value X is an age value, where the business rule would be to replace the battery if it is older than X months. The sample value for X is 60 months, with the option under the rule to not replace the battery based on the battery's age.

The test results for the individual battery are uploaded into the OMS software. The preferred status options generated from an application of the business rules to the test results will be: Pass; Fair; Warn; or Fail. The test results are compared by OMS™ to a known benchmark for the pertinent battery type. Based upon the difference, in percent, between the benchmark value and the actual test value, OMS™ makes the determination as to the status. For example, if a battery tests at 1.87 milliohms and the benchmark is 1.0 milliohms, then the percentage difference is 87% and the battery would Fail; if the battery tests at 1.05 milliohms then the percentage difference is 5% and the battery would Pass. The percentage criteria for determining the status are business rule settings that are determined by the customer and input into OMS™. This methodology is employed for both types of ohmic testing—impedance and conductance. In FIG. 6, based upon the type of battery being tested and the business rule setting for Failure, the example shows that a test result of 2.87 milliohms or higher would result in OMS™ considering the battery to have a status of Fail. In FIG. 6, the impedance value is set at 2.87 milliohms, and the system will issue a Fail message if the impedance value obtained from the test results is greater than 2.87 milliohms.

FIG. 6 also shows a business rule based on the string average variance obtained by the comparing the ohmic test value (either impedance or conductance) measured for a battery in a string to the average conductance value for the battery string. In the sample, the system will generate a replacement notification signal if the conductance value for the individual battery is 25% lower than the average conductance value of the battery string.

Although the present system is fully automated within the limits of the problems faced, a visual inspection of the battery should not be overlooked. Such visual, on site examination is used to determine whether adverse conditions exist that could affect battery life, safety concerns or cause possible environmental damage. Ordinarily, a battery would be replaced if the inspection revealed leakage of electrolyte, cracking of the battery case or any other physical damage that may implicate the above concerns.

The Warn signal is a conditional message that allows the user to determine if a battery should be replaced or not replaced. One consideration is that if other batteries at the same location as the battery in Warn status are to be replaced, it may be more economical and efficient to replace the Warn status battery with the others at the same time. This concept also applies to string replacement, where an entire string of batteries should be replaced if a predetermined percentage of batteries fail, or if substantially all of the batteries in the string are of a predetermined age value. The sample shown in FIG. 6 shows an age value of 3 years based on the installation date, and a replacement message is generated if more than 40% of the batteries in a string generate a Fail message or are at least 3 years old. This business rule utilizes two settings that are determined by the customer and implemented in OMS™: (1) the percentage of the string that is required to trigger the replacement, and (2) the age required to trigger the replacement. Common values for the percentage range from 25–50% and for the age range from 2 years to 4 years.

Finally, the OMS™ platform contains a rich set of connectivity tools. It can easily import/export data in various formats, from plain text to delimited files to Excel to XML. In fact, the battery tester upload module accepts data in both text and XLS formats. OMS™ can also directly access any ODBC compliant data source, such as Oracle, DB2 and other databases. However, we expect that the XML classes in particular will facilitate seamless communication between OMS™ and any related systems.

The specific products utilized to build OMS™
Microsoft Visual FoxPro 7.0 (IDE)
West Wind Web Connection (Base classes for web services)
Macromedia HomeSite (HTML/JavaScript editor; any can be used)
IDAutomation.com bar code fonts
Adobe Acrobat 5.0

Web Connect by West Wind Technologies is a framework of base classes for building web applications. These classes perform all low-level functions for authentication, request management, session management, data formatting and output.

Since other modifications or changes will be apparent to those skilled in the art, there have been described above the principles of this invention in connection with specific apparatus, it is to be clearly understood that this description is made only by way of example and not as a limitation to the scope of the invention.

What is claimed is:

1. A battery testing and replacement notification method comprising the steps of:
   identifying a battery and a site for each identified battery;
   the battery having a plurality of attributes;
   creating a unique identifier for each identified battery;
   generating a set of business rules, the set of business rules comprising a set of baseline values for the plurality of attributes associated with the battery;
   testing each identified battery to acquire test results, the test results comprising a set of battery values for the plurality of the attributes associated with the battery;
   storing the set of business rules and the test results in a computer memory;
   loading the test results in the computer memory;
   comparing the set of baseline values of the business rules with the battery values of the test results to create a report for the battery, the report being a readable computer file;
   generating a status notification signal dependent upon the report for the battery.

2. The method of claim 1, further comprising the step of examining each battery for physical indicia of damage.

3. The method of claim 1, wherein the plurality of attributes of the battery comprises an age value, an impedance value, and a conductance value.

4. The method of claim 3, wherein the baseline value of the age attribute is within a range of about 24 to about 48 months.

5. The method of claim 3, wherein the baseline value of the impedance attribute is about 2.87 milliohms.

6. The method of claim 3, wherein the baseline value of the conductance attribute is about a number 25% lower than an average of a battery string.

7. The method of claim 1, further comprising the step of compiling the test results for each battery on a string and calculating a percentage of batteries that generate a replacement notification signal.

8. The method of claim 7, further comprising the step of generating a string replacement signal if the percentage of the string of batteries that generate a replacement notification signal is greater than 40%.

9. The method of claim 1, wherein the business rules further comprise an automated test signal to schedule battery testing at the end of a period.

10. The method of claim 9, wherein the period is 12 months.

11. The method of claim 1, wherein the step of generating a replacement notification signal comprises instructions for battery replacement keyed to a battery unit to be replaced.

12. The method of claim 1, wherein the instructions for battery replacement further comprise recycling instructions.

13. The method of claim 1, further comprising the step of replacing a battery if the battery is damaged.

14. The method of claim 1, further comprising the step of generating a replacement notification signal if other batteries are to be replaced at a same location.

15. A battery testing and replacement notification method comprising the steps of:
   identifying batteries and a site for each identified battery;
   creating a unique identifier for each identified battery, the identified battery having a plurality of battery values;
   testing each identified battery to acquire test results and loading the test results in a computer;
   generating a set of business rules;
   the set of business rules having a plurality of baseline values;
   the plurality of values comprising an age value and an impedance value;
   applying die set of business rules to the test results of each identified battery;
   generating a replacement notification signal based on a comparison of the test results of the battery to the baseline values of the set of business rules.

16. The method of claim 15, wherein the plurality of baseline values further comprises a conductance value.

* * * * *